United States Patent
Bierl

(10) Patent No.: US 6,816,796 B2
(45) Date of Patent: Nov. 9, 2004

(54) RESISTANCE MEASURING CIRCUIT

(75) Inventor: Lutz Bierl, Erding (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/196,916

(22) Filed: Jul. 17, 2002

(65) Prior Publication Data

US 2003/0023394 A1 Jan. 30, 2003

(51) Int. Cl.$^7$ ............................................. G01R 15/00
(52) U.S. Cl. ...................................................... 702/57
(58) Field of Search ............................. 702/57, 64, 65, 702/117, 126; 324/522, 525, 608, 691, 704, 713

(56) References Cited

U.S. PATENT DOCUMENTS 6,597,183 B1 * 7/2003 Male ........................... 324/607

FOREIGN PATENT DOCUMENTS

| EP | 1 279 964 | * | 1/2003 |
| GB | 2 267 967 A | | 12/1993 |

* cited by examiner

Primary Examiner—Michael Nghiem
(74) Attorney, Agent, or Firm—W. Daniel Swayze, Jr.; W. James Brady; Frederick J. Telecky, Jr.

(57) ABSTRACT

In the resistance measuring circuit, a measuring capacitor (Cm), as controlled by a microcomputer (10), is charged in a first cycle to a predefined charging voltage (Vcc) and discharged via a reference resistor (Rref) to a predefined discharge voltage before then being recharged in a second cycle to the charging voltage and discharged via the resistance to be measured (Rs1) to the discharge voltage. The microcomputer (10) measures in each cycle the time duration between the start of the discharge procedure and the point in time of attaining a predefined fixed value of the voltage between the charging voltage and the discharge voltage across the measuring capacitor (Cm). From the product of the reference resistance and the ratio of the time duration measured in the second and first cycle, the resistance value to be measured is determined. There is provided a closed loop (10, 14, 16) for controlling the discharge voltage to a fixed predefined constant value.

2 Claims, 2 Drawing Sheets

RESISTANCE MEASURING CIRCUIT

FIELD OF THE INVENTION

The present invention relates to a resistance measuring circuit including a measuring capacitor which, as controlled by a microcomputer.

BACKGROUND OF THE INVENTION

In actual practice it is often necessary to measure the value of a resistance to determine a physical parameter which influences the value of the resistance. For temperature measuring, use is made typically of resistances whose values are a function of the temperature existing at the time. This is why to determine the temperature first a resistance value needs to be measured and the actual desired parameter, namely the temperature can then be determined from the measured value. A resistance measuring circuit of the aforementioned kind is described, for example, on page 2–186 of TEXAS INSTRUMENTS "MSP430 Family Application Reports 2000" (SLAA024), the basic circuit of which for this measuring is shown in FIG. 1. The complete measuring procedure is controlled by a microcomputer 10 which may be a TEXAS INSTRUMENTS type MSP430 microcomputer. The measuring circuit contains a measuring capacitor Cm which can be charged via a charging resistor RI to the supply voltage Vcc of the microcomputer 10. For this charging procedure the microcomputer 10 outputs at its terminal TP.3 the supply voltage Vcc whilst switching its terminals TP.0, TP.1 and TP.2 to a high impedance state. This results in a charging circuit which leads to ground Vss via the charging resistor RI and the measuring capacitor Cm. As soon as the measuring capacitor Cm has been charged to the supply voltage Vcc the microcomputer 10 switches the terminal TP.3 to a high impedance state whilst connecting the terminal TP.2 to ground Vss. This results in the measuring capacitor Cm being discharged to ground via the reference resistor Rref. On commencement of the discharge procedure, the microcomputer 10 starts a count which increments until the charging voltage of the measuring capacitor Cm at the input I 27 of the microcomputer 10 drops below a predefined threshold value. The count attained at this point in time is a measure of the time taken from the start of discharge to attaining the threshold value. Subsequent to this first discharge procedure, the measuring capacitor Cm is recharged to the supply voltage Vcc, resulting in the measuring capacitor grounding the terminal TP.1 so that the measuring capacitor Cm is discharged via the measuring resistor Rs1. The same as before, the time duration from the start of the discharge procedure up to attaining the threshold value is determined from the count. If, in addition, the value of the measuring resistor Rs2 is to be determined, a new charging and discharge cycle is implemented as described.

From the times measured and the value of the reference resistor Rref, the value of the measuring resistor Rs1 and correspondingly also, where necessary, the value of the measuring resistor Rs2 can be determined from the formula $$Rs1 = Rref \times \frac{t_{Rs1}}{t_{ref}}$$

How the necessary potentials are applied to the corresponding TP terminals in the microcomputer 10 relative to the terminal TP.0 thereof is evident from FIG. 1. In this arrangement, the necessary switches of the microcomputer 10 are formed by MOS transistors which have a relatively high resistance value in the ON condition which is usually termed the internal resistance Rdson. This internal resistance located in each case in the discharge cycle of the measuring capacitor Cm influences the measuring accuracy achievable with the measuring capacitor as shown in FIG. 1. It is particularly in applications demanding extremely high accuracy, for example in calorimeter temperature measurement, that the temperature-dependent synchronism error of each internal resistance has serious consequences. The discharge curve of the measuring capacitor Cm falls namely asymptotically to a value which is influenced by the internal resistance of the MOS transistor located in the discharge circuit at the time. The temperature-dependent synchronism errors of these internal resistances make it impossible to measure the resistance without additional complicated circuitry when very high accuracy is mandatory.

SUMMARY OF THE INVENTION

The resistance measuring circuit is charged in a first cycle to a predefined charging voltage and discharged via a reference resistor to a predefined discharge voltage before then being recharged in a second cycle to the charging voltage and discharged via the resistance to be measured to the discharge voltage, the microcomputer measuring in each cycle the time duration between the start of the discharge procedure and the point in time of attaining a predefined fixed value of the voltage between the charging voltage and the discharge voltage across the measuring capacitor and determining from the product of the reference resistance and the ratio of the time duration measured in the second and first cycle the resistance value to be measured.

The invention is thus based on the objective of providing a resistance measuring circuit of the aforementioned kind with the aid of which a very high measuring accuracy is achievable which is not influenced by the internal resistances of the analog switches used in controlling the discharge procedure.

To achieve this objective there is provided in the resistance measuring circuit, a closed loop for regulating the discharge voltage to a fixed predefined constant value.

By maintaining the discharge voltage constant with the aid of the closed loop, it is achieved that the measuring capacitor Cm discharges to a discharge voltage value which is not influenced by the internal resistance of a switch located in the discharge circuit. This results in the time needed to discharge the reference resistor and the resistance to be measured being exclusively a function of their resistance values so that the desired high accuracy is achievable.

BRIEF DESCRIPTION OF THE DRAWINGS

Examples of the invention will now be detailed with reference to the drawing in which.

DETAILED DESCRIPTION OF THE DRAWINGS

Figure 1:
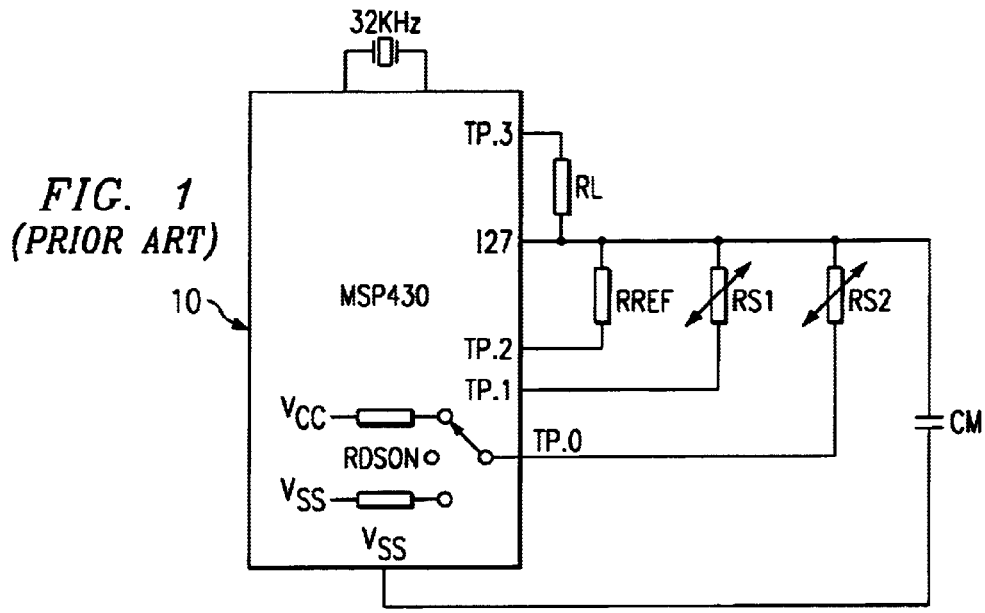
FIG. 1 is a block diagram of a prior art resistance measuring circuit.
Figure 2:
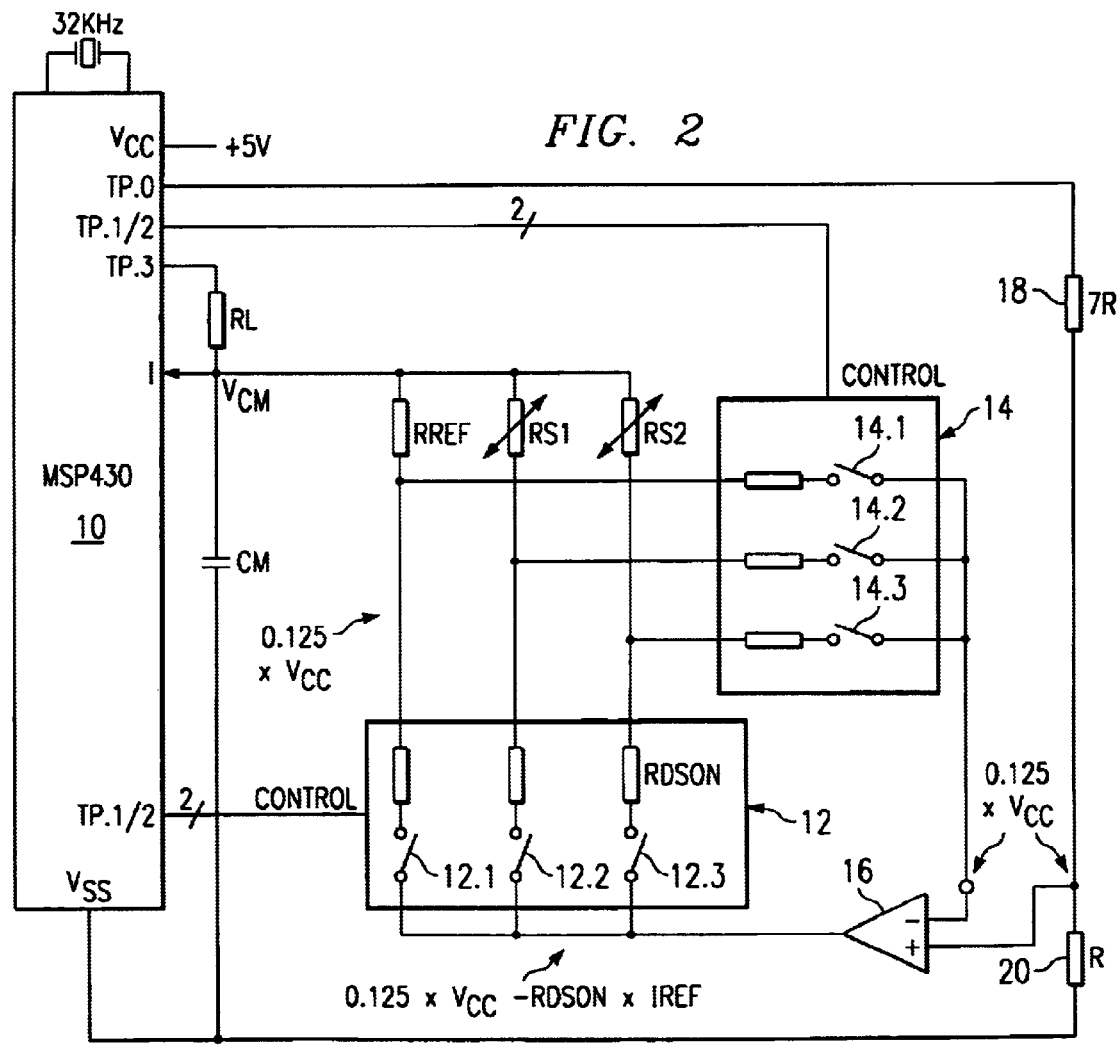
FIG. 2 is a block diagram of a resistance measuring circuit in accordance with the present invention.

Referring now to FIG. 2, there is illustrated the resistance measuring circuit including a microcomputer 10 of the type MSP430. The microcomputer 10 receives a supply voltage Vcc of +5 V relative to ground Vss. It includes terminals TP for outputting control signals having the value of the supply voltage Vcc or of the ground Vss. These outputs are so-called tristate outputs which in addition to the states in which they can output the cited control signals, they may also assume a high impedance state. Furthermore, the microcomputer 10 includes an input I via which it is able to analyze a voltage applied thereto. The input I is the input of a comparator whose task it is to establish whether the voltage supplied to it is above or below a defined threshold value.

The resistance measuring circuit contains further two arrays of analog switches 12, 14 each including three switches 12.1, 12.2, 12.3 and 14.1, 14.2, 14.3 respectively in the form of MOS transistors. Assigned to the switches are resistances to illustrate that the MOS transistors forming the switches also include an internal resistance in the ON state, usually termed Rdson.

Located between the input I and ground is a measuring capacitor Cm, which can be charged via a resistor RI located between the terminal TP.3 and the input I. Furthermore, connected to the input I is a reference resistor Rref and two resistances Rs1 and Rs2 to be measured. In the example application, these two resistances are NTC resistors so that by establishing the resistance values of the two resistors by application of suitable algorithms in the microcomputer 10, the temperatures at the site of each resistance to be measured can be determined.

As evident, the resistances Rref, Rs1 and Rs2 are connected via the switches of the analog switch array 12 to the outputs of a differential amplifier and via the switches of the analog switch array 14 to the inverting input of a differential amplifier 16. The non-inverting input of this differential amplifier 16 receives a fixed voltage formed by a voltage divider made up of two resistors 18 and 20. The values of the resistors 18 and 20 relate in the ratio 7:1 so that a voltage materializes across the non-inverting input of the differential amplifier 16 which amounts to 0.125×Vcc.

The analog switch arrays 12 and 14 can be controlled with the aid of the control signals output by the microcomputer 10 so that the switches 12.1, 12.2, 12.4 and 14.1, 14.2, 14.3 respectively can be opened or closed as required, only the switches assigned to the same resistor Rref, Rs1 or Rs2 being simultaneously closed each time with each switch array.

The sequence in the measuring procedure as implemented with the aid of the resistance measuring circuit as shown in FIG. 2 is as follows:

The microcomputer 10 outputs during the complete measuring procedure at its terminal TP.0 the supply voltage Vcc so that the aforementioned voltage of 0.125×Vcc is permanently applied to the non-inverting input of the differential amplifier 16. On commencement of the actual measuring procedure, the microcomputer 10 opens all switches of the analog switch arrays 12 and 14 by outputting corresponding control signals, and it outputs at terminal TP.3 the supply voltage Vcc, resulting in the measuring capacitor Cm being charged via the resistor RI to the supply voltage Vcc.

Figure 3:
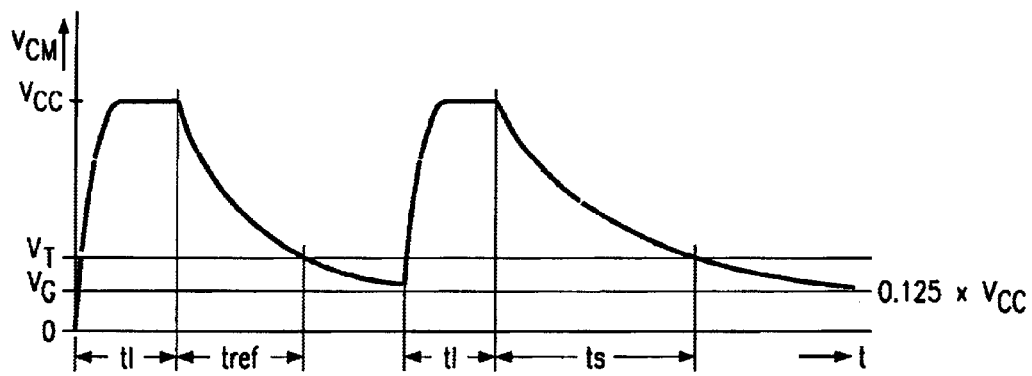
FIG. 3 is a graph to explain how the resistance measuring circuit as shown in FIG. 2 operates.

The charging time period is identified t1 in the plot as shown in FIG. 3.

Once the measuring capacitor Cm has been fully charged, the microcomputer 10 signals the terminal TP.3 HI while closing the switch 12.1 or 14.1 assigned to the reference resistor Rref in the analog switch arrays 12 and 14 respectively by corresponding control signals. This permits discharge of the measuring capacitor Cm via the reference resistor Rref and the closed switch 12.1 to the voltage which is applied from the outputs of the differential amplifier 16 to the terminal of the reference resistor Rref connected to the switch 12.1 of the analog switch array 12. The differential amplifier 16 fed back via the closed switches in the analog switch array 12, 14 has the property of bringing the voltage at its inverting input to the same value as applied to the non-inverting input by outputting a corresponding outputs voltage. So that the differential amplifier 16 is able to produce at its inverting input the same voltage as at its non-inverting input, it needs to output a voltage which is lower than 0.125×Vcc; it being lower by the drop in voltage across the internal resistance Rdson of the closed switch 12.1 resulting from the discharge current Iref of the measuring capacitor Cm flowing via the reference resistor Rref, i.e. a closed loop exists which ensures that the voltage to which the measuring capacitor Cm discharges is always maintained constant at the value 0.125×Vcc.

Because of this closed loop, the internal resistance Rdson of the closed switch in the analog switch array 12 no longer influences the voltage value to which the measuring capacitor Cm is discharged. The slope of the discharge curve is thus solely dictated by the value of the measuring capacitor Cm and the value of the reference resistor Rref.

Referring now to FIG. 3 there is illustrated the plot of the discharge curve indicating how the discharge begins across the voltage value supply voltage Vcc and drops asymptotically to the value Vg corresponding to 0.125×Vcc.

On commencement of the discharge procedure, a counter is started in the microcomputer 10, the count of which is clock incremented until the voltage across the measuring capacitor Cm and thus the voltage at the input I of the microcomputer 10 has attained the value Vt, this designating the threshold value of the comparator internally connected to the input I. As evident from FIG. 3, this is attained on timeout of time duration tref at which the counter is halted so that the attained count is a measure of the time duration tref.

Following this discharge procedure, the measuring capacitor Cm is recharged to the supply voltage Vcc by the microcomputer 10, as evident from FIG. 3. During this charging procedure, all switches in the analog switch array 12 and 14 are opened and charging is done the same as before via the resistor RI.

A new discharge procedure then follows in which, however, the switches 12.2 or 14.2 are closed in the analog switch array 12 and 14 respectively. This means that the measuring capacitor Cm discharges via the resistor Rs1, here again due to the closed loop the constant voltage 0.125×Vcc is set at the terminal of the resistor Rs1 connected to the switch 12.2.

The time duration ts (FIG. 3) between commencement of the discharge procedure and the threshold voltage Vt being attained at input I is again recorded in the form of a count.

In a likewise proceeding third charging and discharge procedure, a third further time duration (not shown in FIG. 3) can be determined in which discharge of the measuring capacitor Cm via the resistor Rs2 occurs.

The value of the resistor Rs1 is established by way of corresponding algorithms in the microcomputer 10 in making use of the formulae as given in the following:

The formula for the time duration tref is:

$$tref = \left[-\ln\frac{V_1}{V_{CC}}\right] \times Cm \times Rref$$

The formula for the time duration ts is:

$$ts = \left[-\ln\frac{V_1}{V_{CC}}\right] \times Cm \times Rs1$$

The resistance value of the resistor Rs1 then being:

$$Rs1 = Rref \times \frac{ts}{tref}$$

It is to be noted that the internal resistances of the switches in the analog switch array 14 are irrelevant to the measurement, since no current flows via these internal resistances in any phase of the measuring procedure, there thus being no drop in voltage across these resistances capable of influencing the result of the measuring procedure.

In the circuit as shown in FIG. 2, it is thus assured, by introducing the constant closed loop control of the voltage to which the measuring capacitor Cm is discharged, that the internal resistances of each of the switches formed by MOS transistors involved have no effect on the measuring result. This now permits achieving a very high accuracy in establishing the wanted resistance value as is necessary, for example, when temperatures needs to be measured in calorimeters in making use of NTC resistors. This temperature measurement requires a highly accurate measurement of the resistance.

Figure 4:
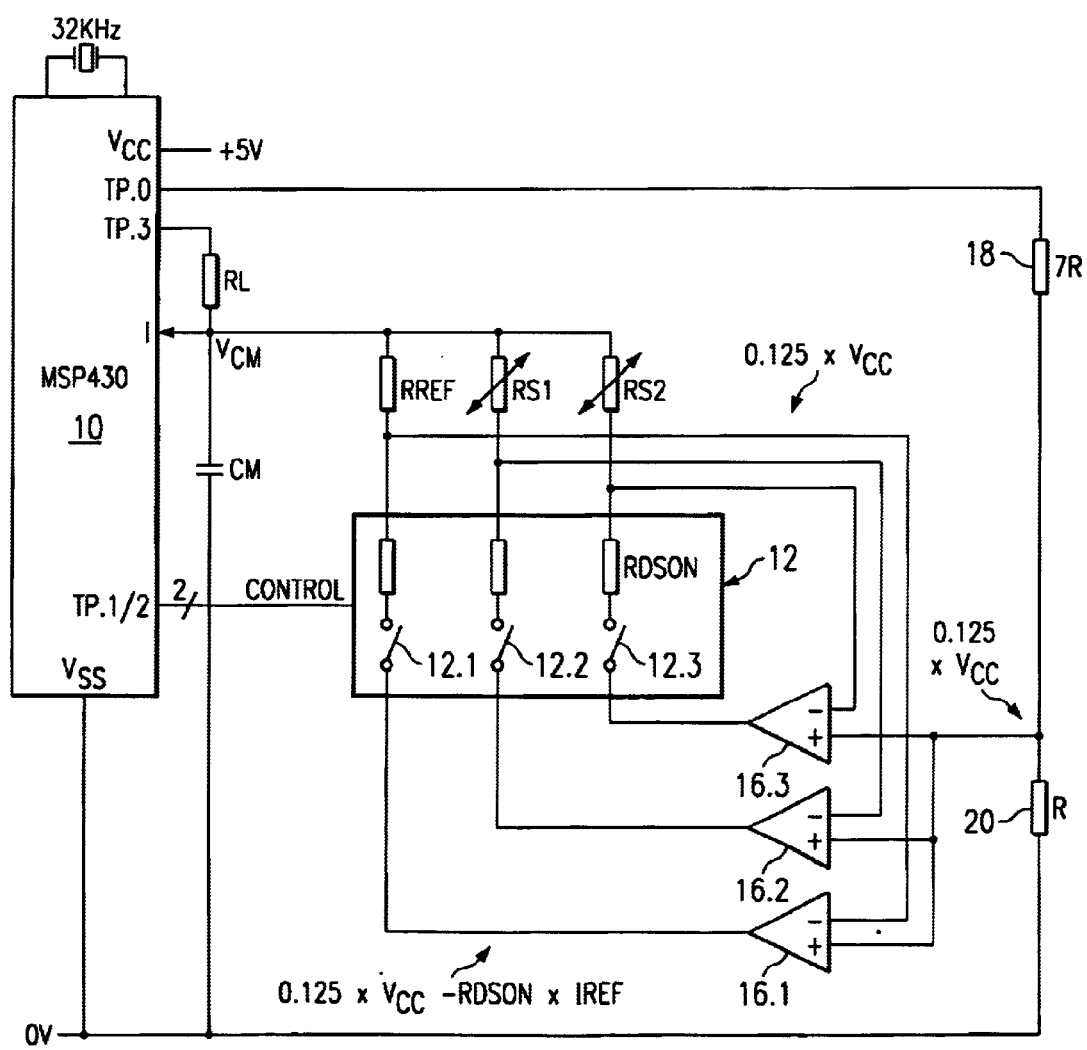
FIG. 4 is another block diagram of a resistance measuring circuit in accordance the present invention.

Referring now to FIG. 4, there is illustrated another example of the resistance measuring circuit in accordance with the invention. In this embodiment, a separate differential amplifier 16.1, 16.2, 16.3 is provided for each resistance to be measured and for the reference resistor so that now only one array of analog switches is needed between the outputs of the differential amplifiers and the resistors. This example has better cost-effectiveness when taking into account that arrays of analog switches in the form of integrated circuits are more complicated and expensive than integrated circuits containing several differential amplifiers.

The procedure in measuring the resistance values is the same as explained with reference to FIG. 2; it likewise being attained in this embodiment that the voltage value to which the measuring capacitor Cm is discharged is regulated by the closed loop to the constant value 0.125×Vcc so that the internal resistances of the switches of the analog switch array 12 cannot falsify the result of the measurement.

What is claimed is:

1. A resistance measuring circuit to measure a resistance comprising:

a microcomputer:

a measuring capacitor which, as controlled by said microcomputer, is charged in a first cycle to a predefined charging voltage and discharged via a reference resistor to a predefined discharge voltage before then being recharged in a second cycle to the charging voltage and discharged via the resistance to be measured to the discharge voltage;

the microcomputer measures in each cycle the time duration between the start of a discharge procedure and the point in time of attaining a predefined fixed value of the voltage between the predefined charging voltage and the predefined discharge voltage across the measuring capacitor and determines from the product of the reference resistance of the referenced resistor and the ratio of the time duration measured in the second and first cycle and the resistance to be measured; and, a closed loop for controlling said discharge voltage to a fixed predefined constant value, wherein said closed loop includes an analog switch which as controlled by signals from said microcomputer to open or close discharge circuits for said measuring capacitor in the corresponding cycles and said closed loop includes a differential amplifier including a non-inverting input and an inverting input, said non-inverting input receiving said discharge voltage, said inverting input being connectable via an analog switch to a terminal of said reference resistor or to said resistance to be measured and an output of which is connectable via an analog switch to the one terminal of said reference resistor or said resistance to be measured.

2. A resistance measuring circuit to measure a resistance comprising:

a microcomputer;

a measuring capacitor which, as controlled by said microcomputer, is charged in a first cycle to a predefined charging voltage and discharged via a reference resistor to a predefined discharge voltage before then being recharged in a second cycle to the charging voltage and discharged via the resistance to be measured to the discharge voltage;

the microcomputer measures in each cycle the time duration between the start of a discharge procedure and the point in time of attaining a predefined fixed value of the voltage between the predefined charging voltage and the predefined discharge voltage across the measuring capacitor and determines from the product of the reference resistance of the referenced resistor and the ratio of the time duration measured in the second and first cycle and the resistance to be measured; and, a closed loop for controlling said discharge voltage to a fixed predefined constant value, wherein an analog switch are controlled by signals from said microcomputer, discharge circuits for said measuring capacitor in the corresponding cycles and in that in said closed loop, a differential amplifier including a non-inverting input and an inverting input is associated to each of said reference resistor and said resistance to be measured, said non-inverting inputs receiving said discharge voltage, said inverting inputs being connectable via an analog switch to a terminal of an assigned resistor of one of said reference resistor and said resistance to be measured, and outputs of which are each connectable via an analog switch to said terminal of said assigned resistor.

* * * * *